(12) United States Patent
Fujimoto et al.

(10) Patent No.: US 8,437,375 B2
(45) Date of Patent: May 7, 2013

(54) SEMICONDUCTOR LASER ELEMENT

(75) Inventors: Tsuyoshi Fujimoto, Ibaraki (JP); Yumi Yamada, Ibaraki (JP); Yuji Yamagata, Ibaraki (JP); Tsuyoshi Saitoh, Ibaraki (JP); Manabu Katahira, Ibaraki (JP)

(73) Assignee: Optoenergy, Inc, Chiba (JP)

( * ) Notice: Subject to any disclaimer, the term of this patent is extended or adjusted under 35 U.S.C. 154(b) by 0 days.

(21) Appl. No.: 12/998,518

(22) PCT Filed: Oct. 31, 2008

(86) PCT No.: PCT/JP2008/069974
§ 371 (c)(1),
(2), (4) Date: Apr. 28, 2011

(87) PCT Pub. No.: WO2010/050071
PCT Pub. Date: May 6, 2010

(65) Prior Publication Data
US 2011/0211608 A1    Sep. 1, 2011

(51) Int. Cl.
*H01S 5/00* (2006.01)
(52) U.S. Cl.
USPC .................................... 372/45.01; 372/43.01
(58) Field of Classification Search ............... 372/43.01, 372/45.01
See application file for complete search history.

(56) References Cited

U.S. PATENT DOCUMENTS

| | | | |
|---|---|---|---|
| 5,020,067 A | 5/1991 | Okada | |
| 5,467,364 A | 11/1995 | Muro et al. | |
| 5,764,668 A * | 6/1998 | Ishizaka et al. | 372/45.01 |
| 5,949,807 A | 9/1999 | Fujimoto et al. | |
| 6,118,799 A * | 9/2000 | Okubo et al. | 372/46.01 |
| 6,434,178 B1 * | 8/2002 | Ubukata | 372/45.011 |

(Continued)

FOREIGN PATENT DOCUMENTS

| | | |
|---|---|---|
| JP | 02-188984 | 7/1990 |
| JP | 02-203586 A | 8/1990 |
| JP | 09-045986 | 2/1997 |
| JP | 2001-102686 A | 4/2001 |

OTHER PUBLICATIONS

S . Hausser et. al. "1.3 pm Multiquantum Well Decoupled Confinement Heterostructure (MQW-DCH) Laser Diodes" IEEE Journal of Quantum Electronics, vol. 29, No. 6. Jun. 1993, pp. 1597-1600.*
International Search Report.

(Continued)

*Primary Examiner* — Jessica Stultz
*Assistant Examiner* — Delma R Forde
(74) *Attorney, Agent, or Firm* — Harness, Dickey & Pierce, P.L.C.

(57) ABSTRACT

A semiconductor laser element may include an n-type clad layer; an n-type waveguide layer adjacent to the n-type clad layer; an n-type carrier blocking layer adjacent to the n-type waveguide layer; an active layer; and a p-type clad layer adjacent to the active layer. The n-type clad layer may have a bandgap width greater than a bandgap width of the n-type waveguide layer. The n-type carrier blocking layer may have a bandgap width greater than or equal to bandgap widths of the first and second barrier layers. The p-type clad layer may have a bandgap width greater than the bandgap widths of the first and second barrier layers and the bandgap width of the n-type waveguide layer. The active layer may include a quantum well layer and barrier layers.

16 Claims, 7 Drawing Sheets

U.S. PATENT DOCUMENTS

| | | | | |
|---|---|---|---|---|
| 6,546,032 B1* | 4/2003 | Oeda et al. | | 372/45.01 |
| 2007/0026620 A1* | 2/2007 | Yamada | | 438/308 |
| 2009/0080484 A1* | 3/2009 | Shigihara | | 372/46.01 |
| 2010/0303114 A1* | 12/2010 | Kosugi | | 372/45.01 |

OTHER PUBLICATIONS

International Preliminary Report on Patentability and English translation dated May 12, 2011.
Sadao Adachi, J. Appl. Phys., 58 (3), R1-29, 1985.
Sadao Adachi, J. Appl. Phys., 53 (12), pp. 8775-8792, 1982.
Sadao Adachi, "Properties of Aluminum Gallium Arsenide", published by INSPEC, 1993, pp. 58-72.
Sadao Adachi, "Physical Properties of III-V Semiconductor Compounds: InP, InAs, GaAs, GaP, InGaAs, and InGaAnP", published by John Wiley & Sons Inc., 1992, pp. 277-278.
Japanese Office Action dated Dec. 18, 2012, for corresponding Japanese Patent Application No. 2010-535611.
English Translation of Japanese Office Action dated Dec. 18, 2012, for corresponding Japanese Patent Application No. 2010-535611.

* cited by examiner

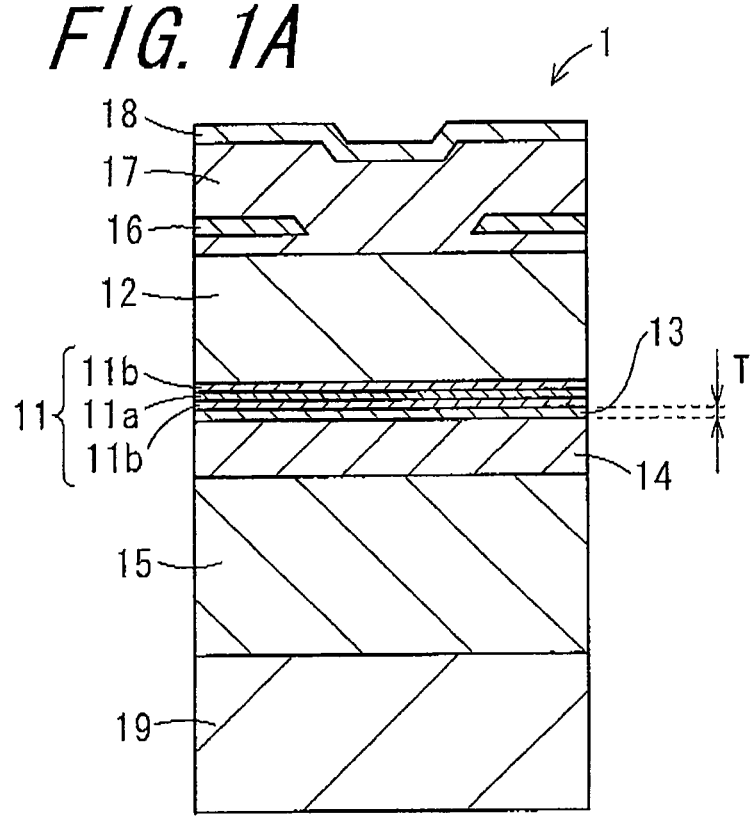

SEMICONDUCTOR LASER ELEMENT

TECHNICAL FIELD

The present invention relates to a semiconductor laser element which is used preferably in communications, laser printers, laser therapy, laser machining or the like, and capable of operating with high efficiency and high output.

BACKGROUND ART

In recent years it has been desired in various fields of application to enhance outputs of semiconductor laser elements. To enhance the output of a semiconductor laser element, firstly, it is necessary to suppress catastrophic optical damage (hereinafter abbreviated to COD) that occurs on an end facet of the semiconductor laser element by reducing the light intensity of a waveguide mode in an active layer of the semiconductor laser element. Secondly, it is necessary to improve the temperature characteristic of the semiconductor laser element by efficiently confining injected carriers within the active layer.

FIGS. 3A to 3D are views showing an example of a semiconductor laser element of a conventional technology. The semiconductor laser element 2 in FIGS. 3A to 3D is a semiconductor laser element of a well known separate confinement heterostructure (hereinafter abbreviated to SCH structure), which exhibits an example in which an active layer 21 comprises one quantum well layer 21a and two barrier layers 21b between which the quantum well layer 21a is sandwiched. FIG. 3A is a cross-sectional view of the semiconductor laser element 2, FIG. 3B is a distribution diagram of bandgap widths corresponding to the respective layers of the semiconductor laser element 2, FIG. 3C is a distribution diagram of refractive indices corresponding to the respective layers of the semiconductor laser element 2, and FIG. 3D is a graph showing a waveguide mode of the semiconductor laser element 2. In FIGS. 3B to 3D, the abscissa represents positions in the semiconductor laser element 2 in the direction of thickness.

The semiconductor laser element 2 of the SCH structure is made by epitaxial growth, on a semiconductor substrate (not shown) formed of n-GaAs, of an n-type clad layer (n-AlGaAs) 22, an active layer (single quantum well layer of GaAs/AlGaAs) 21 comprising a quantum well layer 21a and barrier layers 21b, and a p-type clad layer (p-AlGaAs) 23 one on top of another. Note that, in FIGS. 3B to 3D, the n-type clad layer 22 corresponds to a region between T10 and T11, the quantum well layer 21a corresponds to a region between T12 and T13, the barrier layers correspond to regions between T11 and T12 and between T13 and T14, and the p-type clad layer 23 corresponds to a region between T14 and T15.

The semiconductor laser element 2 of the SCH structure is so configured that each of the clad layers 22, 23 for confining carriers itself assumes the role of confining the waveguide mode. Since the structure for confining the carriers is at the same time the structure for determining the waveguide mode, the semiconductor laser element 2 of the SCH structure has a problem that it is not possible to reduce the light intensity of the waveguide mode in the active layer 21 freely. That is, there is a problem that it is difficult to design the semiconductor laser element 2 so as to suppress occurrence of COD on the end facet, which imposes restriction on making the semiconductor laser element 2 operate with high output.

A semiconductor laser element 3 of a decoupled confinement heterostructure (hereinafter abbreviated to DCH structure), which was proposed with the aim of overcoming the problem with the semiconductor laser element 2 of the SCH structure and designing the light intensity of the waveguide mode in the active layer freely, is disclosed, for example, in Japanese Examined Patent Publication JP-B2 3658048.

FIGS. 4A to 4D are views showing a semiconductor laser element 3 of the DCH structure. FIG. 4A is a cross-sectional view showing the semiconductor laser element 3, FIG. 4B is a distribution diagram of bandgap widths corresponding to the respective layers of the semiconductor laser element 3, FIG. 4C is a distribution diagram of refractive indices corresponding to the respective layers of the semiconductor laser element 3, and FIG. 4D is a graph showing a waveguide mode of the semiconductor laser element 3. In FIGS. 4B to 4D, the abscissa represents positions in the semiconductor laser element 3 in the direction of thickness.

The semiconductor laser element 3 of the DCH structure is made by epitaxial growth, on a semiconductor substrate (not shown) formed of n-GaAs, of an n-type clad layer (n-AlGaAs) 36, an n-type waveguide layer (n-AlGaAs) 34, an n-type carrier blocking layer (n-AlGaAs) 32, an active layer (single quantum well layer of GaAs/AlGaAs) 31 comprising a quantum well layer 31a and barrier layers 31b, a p-type carrier blocking layer (n-AlGaAs) 33, a p-type waveguide layer (n-AlGaAs) 35, and a p-type clad layer (p-AlGaAs) 37 one on top of another. Note that, in FIGS. 4B to 4D, the n-type clad layer 36 corresponds to a region between T20 and T21, the n-type waveguide layer 34 corresponds to a region between T21 and T22, the n-type carrier blocking layer 32 corresponds to a region between T22 and T23, the active layer 31 corresponds to a region between T23 and T24, the p-type carrier blocking layer 33 corresponds to a region between T24 and T25, the p-type waveguide layer 35 corresponds to a region between T25 and T26, and the p-type clad layer 37 corresponds to a region between T26 and T27.

In the semiconductor laser element 3 of the DCH structure, as shown in FIG. 4B, carriers, having overflowed beyond each of the carrier blocking layers 32 and 33 due to temperature increase of the active layer resulting from injection of high driving current, distribute in each of the waveguide layers 34 and 35 having a bandgap width smaller than that of each of the carrier blocking layers 32 and 33. The carriers, once overflowed, are inhibited from diffusing in the opposite direction back into the active layer 31 by the high potential barrier of each of the carrier blocking layers 32 and 33. Accordingly, there is a problem that the efficiency of carrier confinement within the active layer 31 tends to decrease.

Especially, when the semiconductor laser element 3 is formed of a group III-V compound semiconductor such as AlGaAs, InGaAs and InGaAsP, due to a difference in effective mass between electrons and holes, that is, since electrons are smaller in effective mass than holes, in the active layer 31, the carrier density of electrons becomes relatively higher in comparison with the carrier density of holes. In other words, with respect to the carriers overflowing from the inside of the active layer 31, electrons are greater in number than holes. Therefore, with the semiconductor laser element 3, there is a problem that the efficiency of electron confinement tends to decrease.

DISCLOSURE OF INVENTION

An object of the invention is to provide a semiconductor laser element of high efficiency and high output, by suppressing occurrence of COD on its end facet and by ensuring confinement of carriers within an active layer of the semiconductor laser element.

The invention provides a semiconductor laser element comprising:

an active layer comprising a quantum well layer and barrier layers;

an n-type carrier blocking layer arranged so as to be adjacent to the active layer, and having a bandgap width equal to or greater than bandgap widths of the barrier layers;

an n-type waveguide layer arranged on a side opposite to a side of the n-type carrier blocking layer on which the active layer is arranged, so as to be adjacent to the n-type carrier blocking layer;

an n-type clad layer arranged on a side opposite to a side of the n-type waveguide layer on which the active layer is arranged, so as to be adjacent to the n-type waveguide layer, the n-type clad layer having a bandgap width greater than a bandgap width of the n-type waveguide layer; and a p-type clad layer arranged on a side opposite to a side of the active layer on which the n-type carrier blocking layer is arranged, so as to be adjacent to the active layer, the p-type clad layer having a bandgap width greater than bandgap widths of the barrier layers and the n-type waveguide layer.

Further, in the invention, it is preferable that a refractive index of the n-type clad layer is greater than a refractive index of the p-type clad layer.

Further, in the invention, it is preferable that the n-type carrier blocking layer has a layer thickness T of 10 nm≦T≦30 nm.

According to the invention, the structure for confining carriers comprises a p-type clad layer having a sufficient thickness and an extremely thin n-type carrier blocking layer, so that it is possible to confine within the active layer electrons having overflowed due to temperature increase of the active layer resulting from injection of high driving current, and to allow light generated in the active layer to easily pass through the n-type carrier blocking layer.

That is, by keeping the efficiency of confinement of carriers in the active layer high, and making the structure for light confinement independent of the structure for carrier confinement, it is possible to widen the waveguide mode so that the light intensity of the waveguide mode in the active layer is reduced, whereby occurrence of COD on the end facet can be suppressed. Accordingly, a semiconductor laser element of high efficiency and high output can be realized.

BRIEF DESCRIPTION OF THE DRAWINGS

Other and further objects, features, and advantages of the invention will be more explicit from the following detailed description taken with reference to the drawings wherein:

FIG. 1A is a cross-sectional view of a semiconductor laser element 1 according to an embodiment of the invention;

BEST MODE FOR CARRYING OUT THE INVENTION

Hereinafter, preferred embodiments of the invention will be described in detail with reference to the drawings.

Figure 1B:
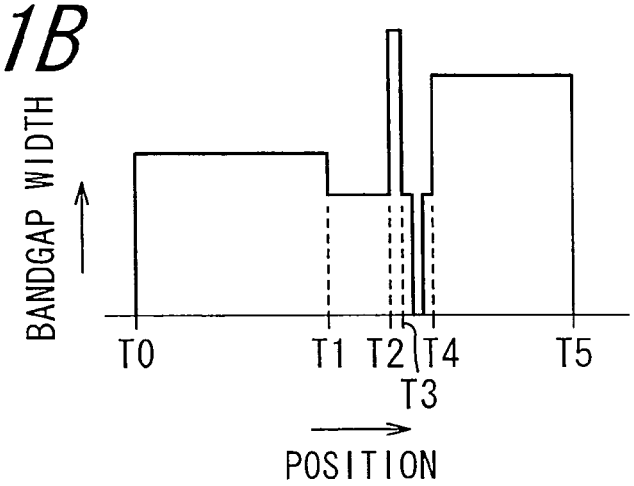
FIG. 1B is a distribution diagram of bandgap widths corresponding to respective layers 11 to 15 of the semiconductor laser element 1.
Figure 1C:
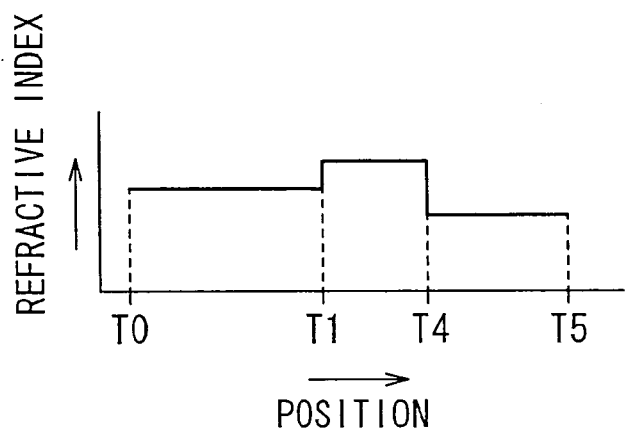
FIG. 1C is a distribution diagram of refractive indices corresponding to the respective layers 11 to 15 of the semiconductor laser element 1.
Figure 1D:
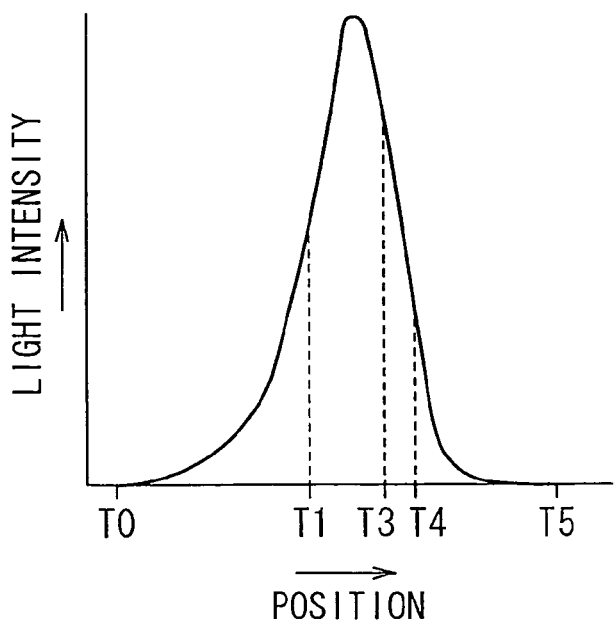
FIG. 1D is a graph showing a waveguide mode in the respective layers 11 to 15 of the semiconductor laser element 1.

FIG. 1A is a cross-sectional view of a semiconductor laser element 1 according to an embodiment of the invention, FIG. 1B is a distribution diagram of bandgap widths corresponding to respective layers 11 to 15 of the semiconductor laser element 1, FIG. 1C is a distribution diagram of refractive indices corresponding to the respective layers 11 to 15 of the semiconductor laser element 1, and FIG. 1D is a graph showing a waveguide mode in the respective layers 11 to 15 of the semiconductor laser element 1. In FIGS. 1B to 1D, the abscissa represents positions in the semiconductor laser element 1 in the direction of thickness. The semiconductor laser element 1 of this embodiment is formed of a group III-V compound semiconductor.

The semiconductor laser element 1 is formed by epitaxial growth, on a semiconductor substrate 19, of an n-type clad layer 15, an n-type waveguide layer 14, an n-type carrier blocking layer 13, an active layer 11, and a p-type clad layer 12 one on top of another. As shown in FIG. 1A, the active layer 11 comprises one quantum well layer 11a and two barrier layers 11b between which the quantum well layer 11a is sandwiched and which have bandgap widths that are greater than a bandgap width of the quantum well layer 11a. Note that, in FIGS. 1B to 1D, the n-type clad layer 15 corresponds to a region between T0 and T1, the n-type waveguide layer 14 corresponds to a region between T1 and T2, the n-type carrier blocking layer 13 corresponds to a region between T2 and T3, the active layer 11 corresponds to a region between T3 and T4, and the p-type clad layer 12 corresponds to a region between T4 and T5.

The semiconductor laser element 1 of this embodiment is of a single quantum well (SQW) structure as described above, but it may be of a multi quantum well (MQW) structure where a plurality of quantum well layers are provided.

On the p-type clad layer 12, a current blocking layer 16, a first p-type contact layer 17, and a second p-type contact layer 18 are formed. Moreover, though not shown, on the bottom surface side of the semiconductor substrate 19 and on the top surface side of the second p-type contact layer 18, ohmic electrodes are formed, respectively. The second p-type contact layer 18 is formed through a process of doping in high concentration in order to attain an ohmic property with the ohmic electrode.

Hereinafter, the semiconductor laser element 1 will be described in detail.

The p-type clad layer 12 is formed so as to have a bandgap width that is greater than bandgap widths of the barrier layers 11b. Further, the n-type carrier blocking layer 13 is formed so as to have a bandgap width that is equal to or greater than the bandgap widths of the barrier layers 11b. The semiconductor laser element 1, with such a configuration, can confine injected carriers efficiently within the active layer 11.

Furthermore, the p-type clad layer 12 is formed so as to have a sufficiently large layer thickness. Therefore, when temperature of the active layer is increased as a result of injection of high driving current, and the electrons confined in the active layer 11 overflow into the p-type clad layer 12, it is possible to cause the electrons having overflowed to diffuse reversely back into the active layer 11 with certain probability.

The n-type carrier blocking layer 13 is formed so as to have a thickness that allows light generated in the active layer 11 to pass easily through the n-type carrier blocking layer 13, that is, a thickness that has extremely little influence on the waveguide mode and does not allow a tunneling phenomenon of the carriers to occur.

Since the n-type carrier blocking layer 13 is formed to be extremely thin, as explained above, the light generated in the active layer 11 can pass easily through the n-type carrier blocking layer 13, even if a refractive index of the n-type carrier blocking layer 13 is smaller than a refractive index of the active layer 11. By selecting properly the n-type waveguide layer and the n-type clad layer which are independent of carrier confinement, it is possible to prevent the waveguide mode from concentrating in the active layer 11. Since it is possible to reduce the light intensity of the wave guide mode in the active layer 31 by widening the waveguide mode, it is possible to suppress occurrence of COD on the end facet. This allows the semiconductor laser element 1 to operate with high output.

Especially, when the semiconductor laser element 1 is formed of a group III-V compound semiconductor such as AlGaAs, InGaAs and InGaAsP, due to a difference in effective mass between electrons and holes, that is, since electrons are smaller in effective mass than holes, in the active layer 11, the carrier density of electrons becomes relatively higher than the carrier density of holes. In other words, with respect to the carriers overflowing from the inside of the active layer 11, electrons are greater in number than holes.

Descriptions are given as to the effective masses of the electrons and holes in a group III-V compound semiconductor, for example, in the following documents (1) to (4).
(1) Sadao Adachi, J. Appl. Phys., 58(3), R1-29, 1985.
(2) Sadao Adachi, J. Appl. Phys., 53(12), p. 8775-8792, 1982.
(3) Sadao Adachi, "Properties of Aluminum Gallium Arsenide", published by INSPEC, 1993, p. 58-72.
(4) Sadao Adachi, "Physical Properties of III-V Semiconductor Compounds: InP, InAs, GaAs, GaP, InGaAs, and InGaAnP", published by John Wiley & Sons Inc., 1992, p. 277-278.

In the semiconductor laser element 1 of the invention formed of a group III-V compound semiconductor, it is possible to cause the electrons having overflowed from the active layer 11 to diffuse reversely back into the active layer 11 by adopting the configuration in which the active layer 11 is sandwiched by the p-type clad layer 12 and the n-type carrier blocking 13 layer mentioned above, so that the efficiency of confining carriers within the active layer 11 is certainly enhanced.

At this time, for example, by forming the n-type carrier blocking layer 13 so as to have a bandgap width greater than the bandgap width of the p-type clad layer 12, the efficiency of confining holes within the active layer 11 is also enhanced, whereby the efficiency of confining carriers within the active layer 11 is enhanced more certainly.

It is preferable that the n-type carrier blocking layer 13 is formed so as to have a layer thickness T of 10 nm≦T≦30 nm. By making the layer thickness T equal to or smaller than 30 nm, the influence of the n-type carrier blocking layer 13 on the waveguide mode is lowered effectively, so that the light generated in the active layer 11 can be guided effectively toward the n-type waveguide layer 14. Further, by making the layer thickness T equal to or greater than 10 nm, it is possible to prevent the function of confining holes from being impaired owing to depletion in the n-type carrier blocking layer 13 and a tunneling effect.

Since the carriers can be confined within the active layer 11 efficiently by the n-type carrier blocking layer 13 and the p-type clad layer 12 as mentioned above, it is possible to design the n-type waveguide layer 14 and the n-type clad layer 15 independently of the structure for confining carriers.

The n-type waveguide layer 14 is formed so as to have a bandgap width smaller than bandgap widths of the n-type clad layer 15 and the p-type clad layer 12. In a group III-V compound semiconductor, the greater the bandgap width thereof becomes, the smaller the refractive index thereof becomes. Accordingly, the refractive indices of the n-type clad layer 15 and the p-type clad layer 12 are smaller than the refractive index of the n-type waveguide layer 14. Therefore, when the active layer 11 and the n-type carrier blocking layer 13 are sufficiently thin so that their influence on the waveguide mode is negligible, the distribution of the effective refractive index of each of the layers from the active layer 11 to the n-type waveguide layer 14 constitutes a portion of higher refractive index compared to the n-type clad layer 15 and the p-type clad layer 12, as shown in FIG. 1C. Due to this situation, the light generated in the active layer 11 propagates wide in the portion of higher refractive index. That is, the light intensity of the waveguide mode in the active layer 11 can be reduced, so that occurrence of COD on the end facet can be suppressed. Accordingly, it is possible to make the semiconductor laser element 1 operate with high output.

As shown in FIG. 1C, the n-type clad layer 15 is preferably formed so that the refractive index thereof is greater than the refractive index of the p-type clad layer 12. Due to this relation, the waveguide mode can be shifted toward the layers formed by the n-type semiconductors. In other words, it is possible to increase an overlapping rate of the layers formed of the n-type semiconductors and the waveguide mode.

It is generally known that, in semiconductor lasers, internal loss occurs due to absorption of free carriers, and that the absorption of free carriers are less in n-type semiconductors than in p-type semiconductors. Therefore, by designing the semiconductor laser element 1 such that the overlapping rate of the waveguide mode and the layers formed of the n-type semiconductors is high, for example, 90% or higher, the internal loss can be reduced as much as possible, so that the slope efficiency in increased. Accordingly, it is possible to make the semiconductor laser element 1 operate with high efficiency and high output.

EXAMPLE

The semiconductor laser element 1 is made by epitaxial growth, on a semiconductor substrate (n-GaAs) 19, of an n-type clad layer (n-Al$_{0.37}$Ga$_{0.63}$As, 3.5 μm thick) 15, an n-type waveguide layer (n-Al$_{0.30}$Ga$_{0.70}$As, 0.4 μm thick) 14, an n-type carrier blocking layer (n-Al$_{0.60}$Ga$_{0.40}$As, 0.013 μm thick) 13, an active layer (SQW: single quantum well, In$_{0.11}$Ga$_{0.89}$As/Al$_{0.30}$Ga$_{0.70}$As, 0.006 μm thick quantum well layer/0.05 μm thick barrier layer) 11, and a p-type clad layer (p-Al$_{0.50}$Ga$_{0.50}$As, 1.1 μm thick) 12 one on top of another.

Further, on the p-type clad layer 12, a current blocking layer (n-GaAs, 0.3 μm thick) 16, a first p-type contact layer (p-GaAs, 1.7 μm thick) 17, and a second p-type contact layer (p-GaAs, 0.3 μm thick) 18 are formed.

The semiconductor laser element 1 having such a structure can be manufactured through epitaxial growth such as molecular beam epitaxy (MBE) or metal organic chemical vapor deposition (MOCVD). Note that the semiconductor laser element 1 of the example is manufactured through MOCVD.

It is understood from FIG. 1D that, in the semiconductor laser element 1 of the example, most of the waveguide mode propagates within the layers formed of n-type semiconductors in which internal loss is relatively small. Specifically, the overlapping rate of the waveguide mode and the layers formed of the n-type semiconductors is 90% or higher.

Figure 2:
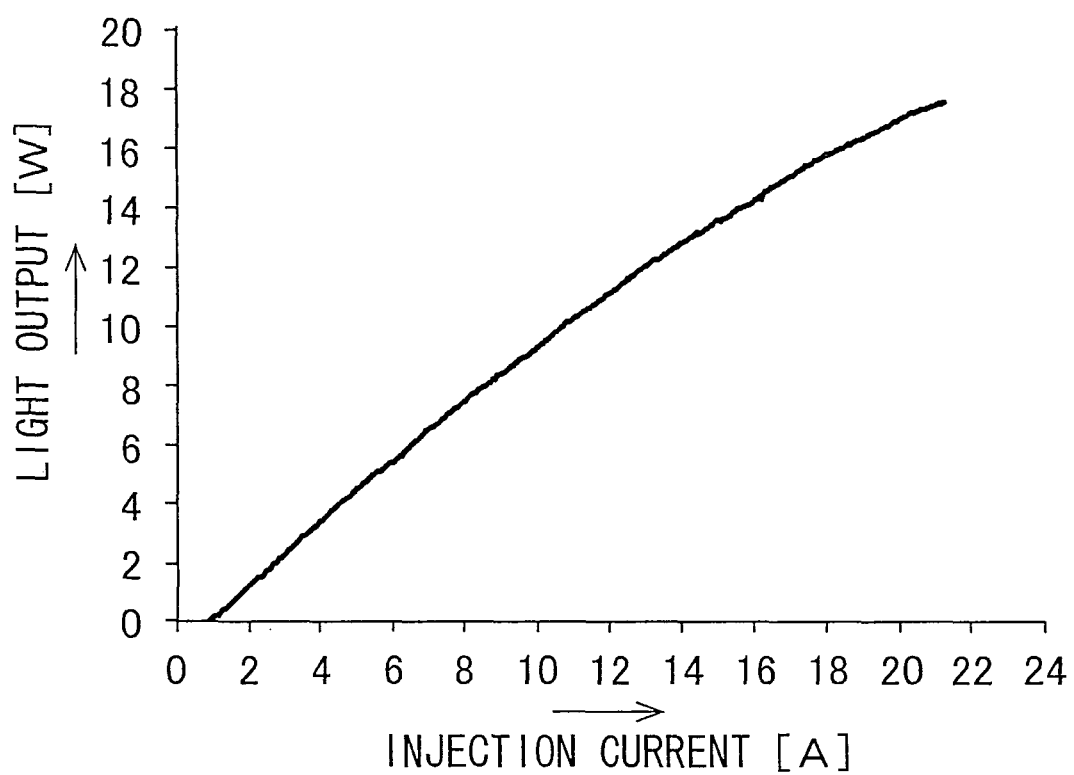
FIG. 2 is a diagram showing an output property of the semiconductor laser element 1 of the example.
Figure 3A:
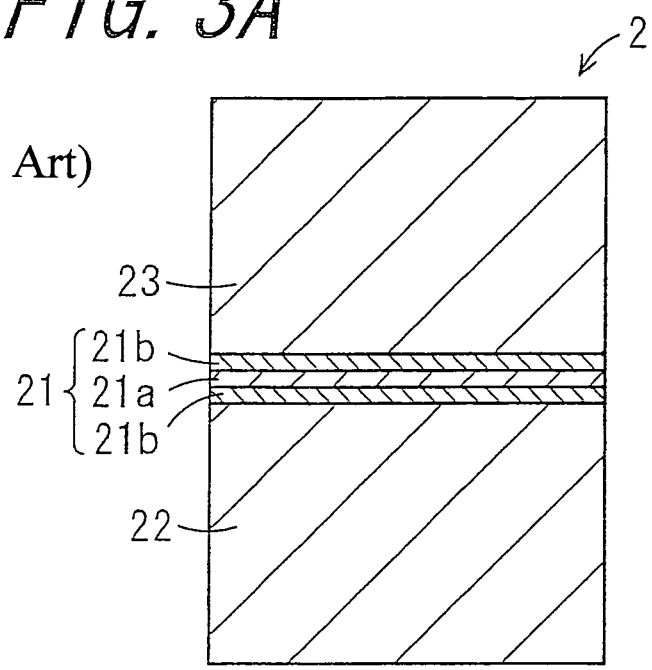
FIG. 3A is a cross-sectional view of a semiconductor laser element 2.
Figure 3B:
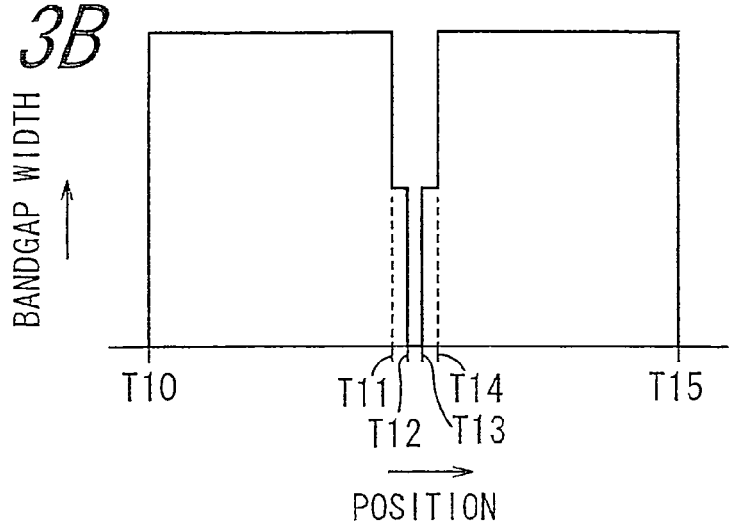
FIG. 3B is a distribution diagram of bandgap widths corresponding to respective layers of the semiconductor laser element 2.
Figure 3C:
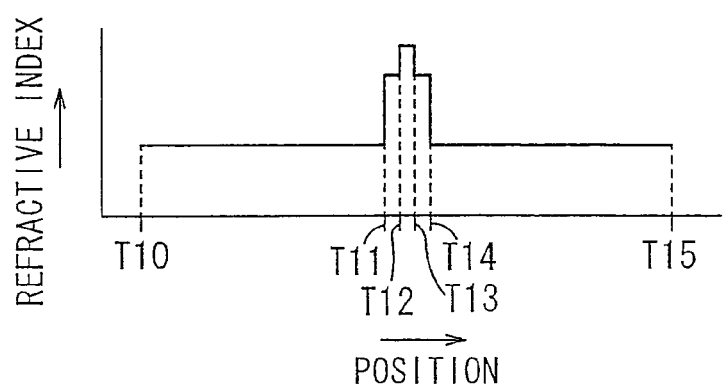
FIG. 3C is a distribution diagram of refractive indices corresponding to the respective layers of the semiconductor laser element 2.
Figure 3D:
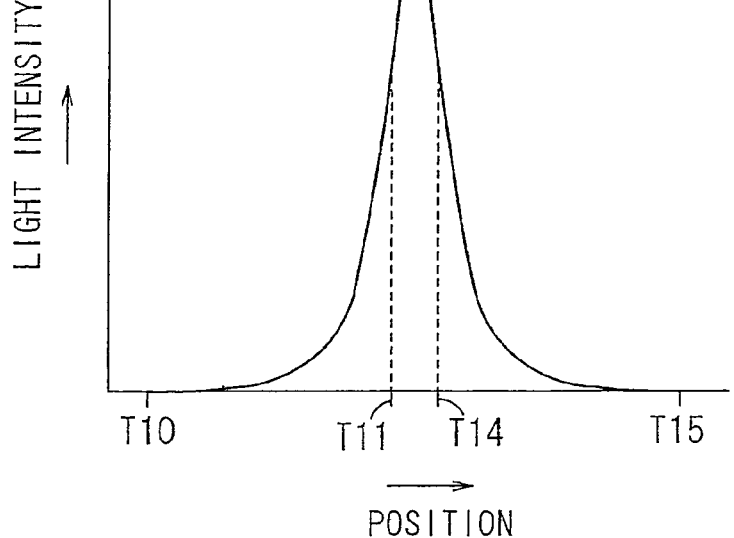
FIG. 3D is a graph showing a waveguide mode of the semiconductor laser element 2.
Figure 4A:
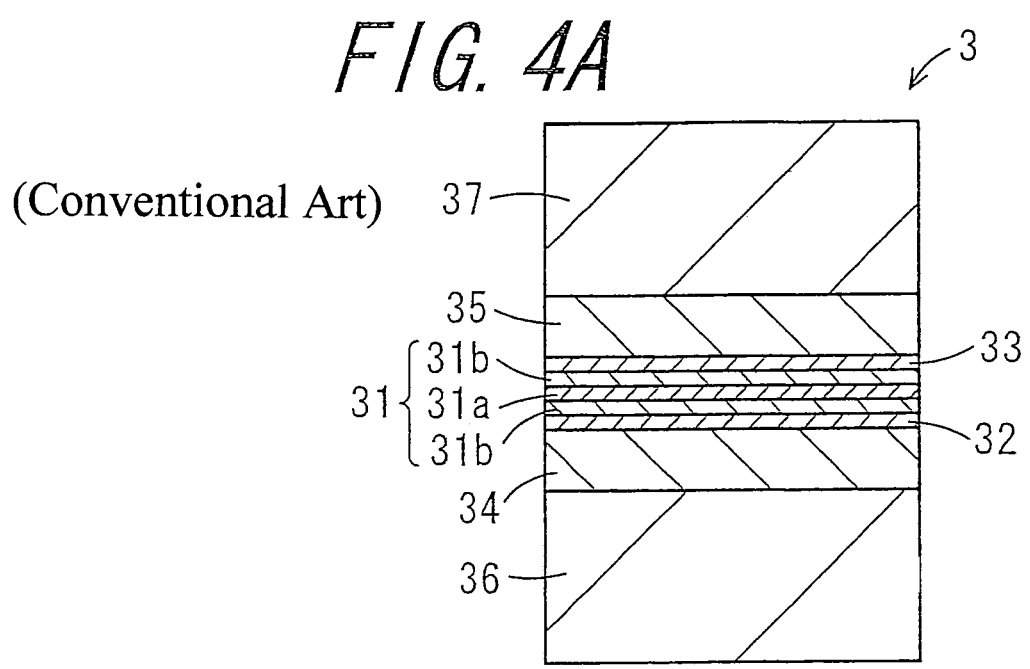
FIG. 4A is a cross-sectional view showing a semiconductor laser element 3.
Figure 4B:
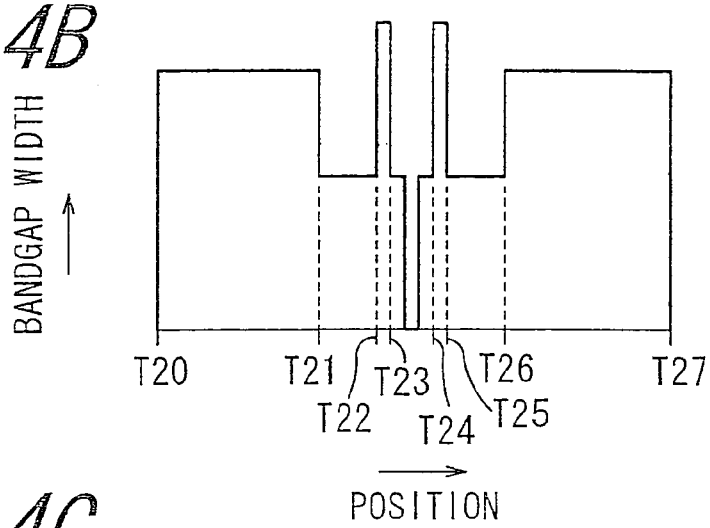
FIG. 4B is a distribution diagram of bandgap widths corresponding to respective layers of the semiconductor laser element 3.
Figure 4C:
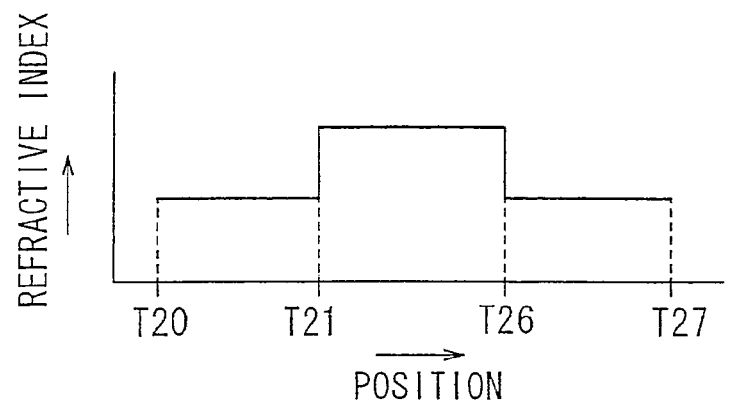
FIG. 4C is a distribution diagram of refractive indices corresponding to the respective layers of the semiconductor laser element 3.
Figure 4D:
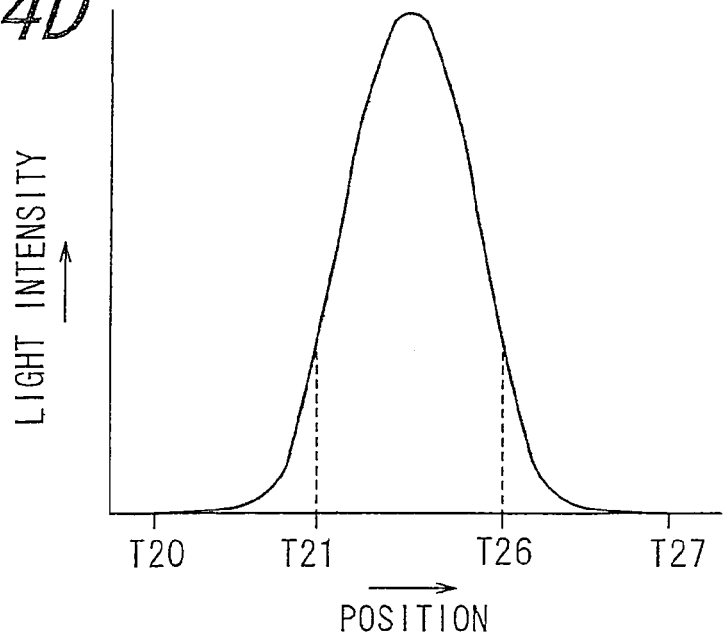
FIG. 4D is a graph showing a waveguide mode of the semiconductor laser element 3.

FIG. 2 is a diagram showing an output property of the semiconductor laser element 1 of the example. The semiconductor laser element 1 is made such that a current injection stripe width is 100 μm, a cavity length is 4 mm, and an antireflection/high reflectivity (AR/HR) reflection rate is 2.5/98%. It was verified that the maximum output was 17 W or higher, as shown in FIG. 2, under the driving condition of continuous wave (CW) at 15° C. It was also verified that the slope efficiency is 1.1 when the injection current is in the range of 1 A to 8 A. These facts mean that the semiconductor laser element 1 can operate with high efficiency and high output, in accordance with the aim of the invention.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A semiconductor laser element, comprising:
    an active layer comprising a quantum well layer and barrier layers;
    an n-type carrier blocking layer adjacent to the active layer;
    an n-type waveguide layer adjacent to the n-type carrier blocking layer on a side opposite to the active layer;
    an n-type clad layer adjacent to the n-type waveguide layer on the side opposite to the active layer; and
    a p-type clad layer contiguous to the active layer on a side opposite to the n-type carrier blocking layer;
    wherein the n-type clad layer has a bandgap width greater than a bandgap width of the n-type waveguide layer,
    wherein the n-type carrier blocking layer has a bandgap width greater than or equal to bandgap widths of the barrier layers, and
    wherein the p-type clad layer has a bandgap width greater than the bandgap widths of the barrier layers and the bandgap width of the n-type waveguide layer.

2. The semiconductor laser element of claim 1, wherein a refractive index of the n-type clad layer is greater than a refractive index of the p-type clad layer.

3. The semiconductor laser element of claim 1, wherein the n-type carrier blocking layer has a layer thickness T of 10 nm≦T≦30 nm.

4. The semiconductor laser element of claim 2, wherein the n-type carrier blocking layer has a layer thickness T of 10 nm≦T≦30 nm.

5. The semiconductor laser element of claim 1, wherein the n-type carrier blocking layer has a layer thickness T of greater than 10 nm.

6. The semiconductor laser element of claim 1, wherein the n-type carrier blocking layer has a layer thickness T of less than 30 nm.

7. The semiconductor laser element of claim 1, wherein the bandgap width of the n-type carrier blocking layer is greater than the bandgap widths of the barrier layers.

8. The semiconductor laser element of claim 1, wherein the bandgap width of the n-type carrier blocking layer is greater than the bandgap width of the n-type clad layer.

9. The semiconductor laser element of claim 1, wherein the bandgap width of the n-type carrier blocking layer is greater than the bandgap width of the n-type waveguide layer.

10. A semiconductor laser element, comprising:
    an n-type clad layer;
    an n-type waveguide layer adjacent to the n-type clad layer;
    an n-type carrier blocking layer adjacent to the n-type waveguide layer;
    a first barrier layer adjacent to the n-type carrier blocking layer;
    a quantum well layer adjacent to the first barrier layer;
    a second barrier layer adjacent to the quantum well layer; and
    a p-type clad layer contiguous to the second barrier layer;
    wherein the n-type clad layer has a bandgap width greater than a bandgap width of the n-type waveguide layer,
    wherein the n-type carrier blocking layer has a bandgap width greater than or equal to bandgap widths of the first and second barrier layers, and
    wherein the p-type clad layer has a bandgap width greater than the bandgap widths of the first and second barrier layers and the bandgap width of the n-type waveguide layer.

11. The semiconductor laser element of claim 10, wherein the bandgap width of the first barrier layer is equal to the bandgap width of the second barrier layer.

12. The semiconductor laser element of claim 10, wherein the bandgap width of the n-type carrier blocking layer is greater than the bandgap widths of the first and second barrier layers.

13. The semiconductor laser element of claim 10, wherein the bandgap width of the n-type carrier blocking layer is greater than the bandgap width of the n-type clad layer.

14. The semiconductor laser element of claim 10, wherein the bandgap width of the n-type carrier blocking layer is greater than the bandgap width of the n-type waveguide layer.

15. The semiconductor laser element of claim 1, wherein the active layer is formed of InGaAs/AlGaAs.

16. The semiconductor laser element of claim 10, wherein the quantum well layer is formed of InGaAs/AlGaAs,
    wherein the first barrier layer is formed of InGaAs/AlGaAs, and
    wherein the second barrier layer is formed of InGaAs/AlGaAs.

* * * * *